US009859395B2

(12) United States Patent
Schmidt et al.

(10) Patent No.: US 9,859,395 B2
(45) Date of Patent: Jan. 2, 2018

(54) SEMICONDUCTOR DEVICE WITH A PASSIVATION LAYER

(71) Applicant: Infineon Technologies AG, Neubiberg (DE)

(72) Inventors: Gerhard Schmidt, Wernberg-Wudmath (AT); Josef-Georg Bauer, Markt Indersdorf (DE); Carsten Schaeffer, Annenheim (AT); Oliver Humbel, Maria Elend (AT); Angelika Koprowski, Klagenfurt (AT); Sirinpa Monayakul, Villach (AT)

(73) Assignee: Infineon Technologies AG, Neubiberg (DE)

( * ) Notice: Subject to any disclaimer, the term of this patent is extended or adjusted under 35 U.S.C. 154(b) by 168 days.

(21) Appl. No.: 14/502,882

(22) Filed: Sep. 30, 2014

(65) Prior Publication Data

US 2015/0056788 A1     Feb. 26, 2015

Related U.S. Application Data

(62) Division of application No. 13/598,488, filed on Aug. 29, 2012, now Pat. No. 8,884,342.

(51) Int. Cl.
*H01L 21/02*     (2006.01)
*H01L 29/66*     (2006.01)
(Continued)

(52) U.S. Cl.
CPC .... *H01L 29/66143* (2013.01); *H01L 21/0217* (2013.01); *H01L 21/02115* (2013.01); *H01L 21/02167* (2013.01); *H01L 21/02203* (2013.01); *H01L 21/283* (2013.01); *H01L 23/3171* (2013.01); *H01L 23/3192* (2013.01); *H01L 29/408* (2013.01); *H01L 29/47* (2013.01); *H01L 29/7397* (2013.01); *H01L 29/7811* (2013.01);
(Continued)

(58) Field of Classification Search
CPC ....................................................... H01L 21/71
See application file for complete search history.

(56) References Cited

U.S. PATENT DOCUMENTS 5,793,072 A * 8/1998 Kuo .................... H01L 29/6675
257/241
6,201,279 B1    3/2001 Pfirsch
(Continued)

FOREIGN PATENT DOCUMENTS

JP            04133472 A      5/1992

OTHER PUBLICATIONS

"Aluminium," Wikipedia, the free encyclopedia, downloaded from http://en.wikipedia.org/wiki/Aluminium, Mar. 15, 2012, 21 pages.
(Continued)

*Primary Examiner* — Cheung Lee
(74) *Attorney, Agent, or Firm* — Slater Matsil, LLP

(57) ABSTRACT

A semiconductor device includes a semiconductor body with a first surface, a contact electrode arranged on the first surface, and a passivation layer on the first surface adjacent the contact electrode. The passivation layer includes a layer stack with an amorphous semi-insulating layer on the first surface, a first nitride layer on the amorphous semi-insulating layer, and a second nitride layer on the first nitride layer.

36 Claims, 4 Drawing Sheets

(51) Int. Cl.
*H01L 29/40* (2006.01)
*H01L 29/861* (2006.01)
*H01L 29/739* (2006.01)
*H01L 29/78* (2006.01)
*H01L 23/31* (2006.01)
*H01L 21/283* (2006.01)
*H01L 29/47* (2006.01)
*H01L 29/06* (2006.01)

(52) U.S. Cl.
CPC ...... *H01L 29/7813* (2013.01); *H01L 29/8611* (2013.01); *H01L 29/0615* (2013.01); *H01L 29/0638* (2013.01); *H01L 2924/0002* (2013.01)

(56) References Cited

U.S. PATENT DOCUMENTS

| | | |
|---|---|---|
| 7,109,101 B1 | 9/2006 | Wright et al. |
| 8,039,203 B2 | 10/2011 | Wang et al. |
| 2003/0183900 A1 | 10/2003 | Barthelmess et al. |
| 2004/0082173 A1 | 4/2004 | Watatani |
| 2005/0156284 A1 | 7/2005 | Schmidt |
| 2005/0194662 A1 | 9/2005 | Schmidt et al. |
| 2006/0170058 A1 | 8/2006 | Chiang et al. |
| 2007/0222023 A1 | 9/2007 | Schmidt |
| 2007/0248808 A1 | 10/2007 | Lee et al. |
| 2009/0008723 A1 | 1/2009 | Schmidt |
| 2009/0269924 A1 | 10/2009 | Choi et al. |
| 2010/0052047 A1 | 3/2010 | Schmidt |
| 2011/0136286 A1* | 6/2011 | Stewart ............... C23C 16/0245 438/57 |
| 2011/0272735 A1 | 11/2011 | Schmidt |

OTHER PUBLICATIONS

"Weibull Distribution," Wikipedia, the free encyclopedia, downloaded from http://en.wikipedia.org/wiki/Weibull_distribution, Jun. 11, 2012, 13 pages.

* cited by examiner

SEMICONDUCTOR DEVICE WITH A PASSIVATION LAYER

This application is a divisional application of application Ser. No. 13/598,488 filed on Aug. 29, 2012, which is incorporated herein by reference.

TECHNICAL FIELD

Embodiments of the present invention relate to a semiconductor device, in particular a power semiconductor device and in particular a power semiconductor device with a passivation layer.

BACKGROUND

Power semiconductor device such as power diodes or power transistors are capable of blocking high voltages of several 10V, several 100V or even several kilovolts (kV). A high blocking voltage is associated with high electric fields in a semiconductor body in which active regions of the semiconductor device are integrated. Especially surfaces of the semiconductor body where high electric fields occur in a blocking state are very sensitive and require a suitable treatment in order to prevent degradation effects that may result in a reduction of the voltage blocking capability. Such treatment usually includes the formation of a passivation layer on the surface. A suitable conventional passivation layer material is, e.g., a semiconductor oxide, such as silicon dioxide $SiO_2$.

There is a need to provide a semiconductor device with a mechanically and chemically very robust passivation layer.

SUMMARY OF THE INVENTION

A first embodiment relates to a semiconductor device. The semiconductor device includes a semiconductor body with a first surface, a contact electrode arranged on the first surface, and a passivation layer on the first surface adjacent the contact electrode. The passivation layer includes a layer stack with an amorphous semi-insulating layer on the first surface, a first nitride layer on the amorphous semi-insulating layer, and a second nitride layer on the first nitride layer.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like features.

DETAILED DESCRIPTION OF ILLUSTRATIVE EMBODIMENTS

In the following Detailed Description, reference is made to the accompanying drawings, which form a part thereof, and in which is shown by way of illustration specific embodiments in which the invention may be practiced.

Figure 1:
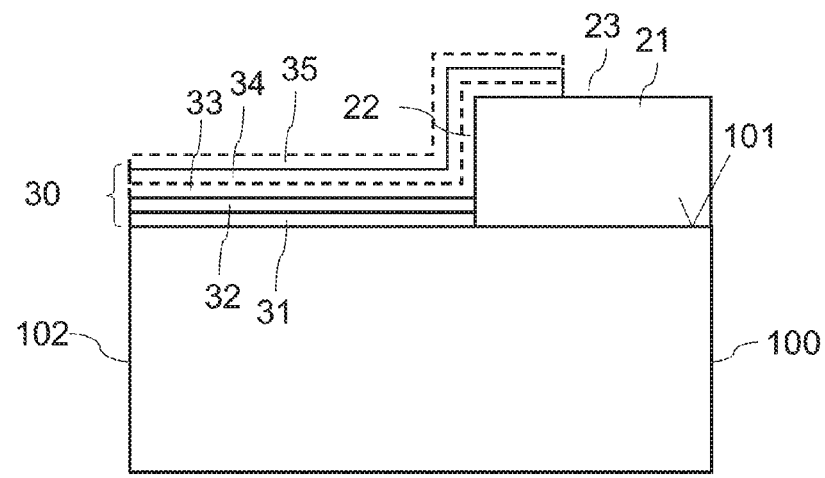
FIG. 1 illustrates a vertical cross sectional view of a semiconductor device including a passivation layer on a first surface.

FIG. 1 illustrates a vertical cross sectional view of a section of a semiconductor device, such as a power semiconductor device. The semiconductor device includes a semiconductor body 100 with a first surface 101. The semiconductor body 100 may include a conventional semiconductor material, such as silicon (Si), silicon carbide (SiC), and the like. The semiconductor device further includes a contact electrode 21 on the first surface 101 and adjoining the semiconductor body 100. The contact electrode 21 includes, e.g., aluminum, copper, an aluminum alloy, a copper alloy, or an aluminum-copper alloy such as AlSiCu.

The contact electrode 21 does not completely cover the first surface 101. A passivation layer 30 is formed at least in those regions of the first surface 101 adjacent the contact electrode 21 and not covered by the contact electrode 21. The passivation layer protects the first surface 101 of the semiconductor body 100 and provides for a long-term stability of the semiconductor device. In particular, the passivation layer 30 prevents, or at least reduces, degradation processes that may occur when a semiconductor device is operated in a humid atmosphere. Those degradation processes may occur, in particular, in those regions of the first surface 101 where high electric fields may occur.

The basic device structure illustrated in FIG. 1 with a semiconductor body 100, a contact electrode 21 on the first surface 101 of the semiconductor body 100, and a passivation layer 30 can be found in a plurality of different semiconductor devices and is not restricted to one specific type of semiconductor device. Thus, in FIG. 1 only the semiconductor body 100, but not specific device regions implemented in the semiconductor body 100 are illustrated. Some embodiments of specific semiconductor devices and of specific device structures in the semiconductor body 100 are explained with reference to FIGS. 2 to 6 below.

Referring to FIG. 1, the passivation layer 30 includes a layer stack with several layers formed one above the other. The layer stack includes an amorphous semi-insulating layer 31 on the first surface 101. According to one embodiment, the amorphous semi-insulating layer 31 adjoins the first surface 101. The amorphous semi-insulating layer is, e.g., an amorphous hydrogen doped (hydrogen containing) layer such as an amorphous hydrogen doped silicon carbide (aSiC:H) layer, an amorphous hydrogen doped carbon (aC:H) layer, an amorphous hydrogen doped silicon (aSi:H) layer, or the like. By virtue of its semi-insulating properties, the amorphous semi-insulating layer may not only serve to passivate the first surface 101, but may also act as an electrically active layer that influences the potential distribution along the first surface 101. Nevertheless, an amorphous semi-insulating layer is mechanically very hard and therefore provides for a good mechanical protection of the semiconductor body 100. For example, the hardness (according to Vickers) of an aSiC:H layer is about 21 GPa and the Young's modulus (elasticity modulus) is about 110 GPa.

Referring to FIG. 1, the layer stack further includes a first nitride layer such as a silicon-nitride ($Si_3N_4$) layer adjoining the amorphous semi-insulating layer. Nitride layers, like the first nitride layer 32, have a high chemical resistance. Further, nitride layers are relatively hard. The hardness is typically about 23 GPa, while the Young's modulus is about 165 GPa. Thus, the first nitride layer chemically and mechanically protects the amorphous semi-insulating layer 31 and, therefore, the semiconductor body 100. However, nitride layers, like the first nitride layer, are relatively brittle. In order to prevent mechanical defects, that may especially occur in those regions where a brittle material layer is curved, the first nitride layer 32, like the amorphous semi-insulating layer 31, is a planar layer. That is, the first nitride layer 32, as well as the amorphous semi-insulating layer 31, essentially is parallel to the first surface 101. Both the amorphous semi-insulating layer 31 and the first nitride layer 32 extend to the contact electrode 21 and adjoin the contact electrode 21, but do not extend along a sidewall 22 of the contact electrode 21. In the embodiment of FIG. 1, the sidewall 22 of the contact electrode 21 is drawn to be essentially vertical. However, this is only an example, the sidewall 22 could also be formed with an angle relative to the first surface 101 other than 90°.

Referring to FIG. 1, the layer stack of the passivation layer 30 further includes a second nitride layer 34 above the first nitride layer 32. The material of the second nitride layer 34 may correspond to the material of the first nitride layer 32. The second nitride layer 34 may extend along the sidewall 22 of the contact electrode 21 and may cover sections of an upper surface 23 adjacent the sidewall 22 of the contact electrode 21. The second nitride layer 34, however, does not completely cover the upper surface 23 of the contact electrode 21. In regions of the upper surface 23 that are not covered by the second nitride layer 34 the contact electrode 21 may be contacted through bond wires (not shown), or the like.

Optionally, the layer stack includes an intermediate layer 33 (illustrated in dashed lines in FIG. 1) between the first nitride layer 32 and the second nitride layer 34. According to one embodiment, the intermediate layer 33 is a ductile layer having a hardness that is between the hardness of the material of the contact electrode 21 and the hardness of the first and second nitride layers 32, 34. According to one embodiment, the hardness of the intermediate layer 33 is between 50 GPa and 70 GPa, while the Young's modulus is between 7 GPa and 10 GPa. According to one embodiment, the intermediate layer includes a silicate glass, such as an undoped silicate glass (USG), a phosphorous doped silicate glass (PSG), a boron doped silicate glass (BSG), or a boron and phosphorous doped silicate glass (BPSG). The intermediate layer 33 provides for a mechanical relief in the layer stack. Like the second nitride layer 34 the intermediate layer 33 may extend along the sidewall 22 and may cover sections of the upper surface 23 of the contact electrode 21.

In the passivation layer 30, the second nitride layer 34 protects the first nitride layer 32 and covers defect regions of the first nitride layer 32 that are possibly present in the first nitride layer 32.

Optionally, the passivation layer 30 further includes an oxide layer 35 on top of the second nitride layer 34. The oxide layer 35 is, e.g., a silicon oxide ($SiO_2$) layer.

Referring to FIG. 1, the passivation layer 30 may completely cover the first surface 101 on the semiconductor body 100 between the contact electrode 21 and an edge surface 102 of the semiconductor body 100. The edge surface 102 terminates the semiconductor body 100 in a horizontal direction of the semiconductor body 100. However, this is only an example. According to a further embodiment, the passivation layer 30 may leave sections of the first surface 101 uncovered. For example, in a semiconductor body in which a power semiconductor device and low-voltage semiconductor devices are integrated, the passivation layer may not cover those regions of the first surface 101 below which the low-voltage devices are integrated. However, in each of these embodiments, the passivation layer 30 may completely surround the contact electrode 21 on the first surface 101.

Figure 2:
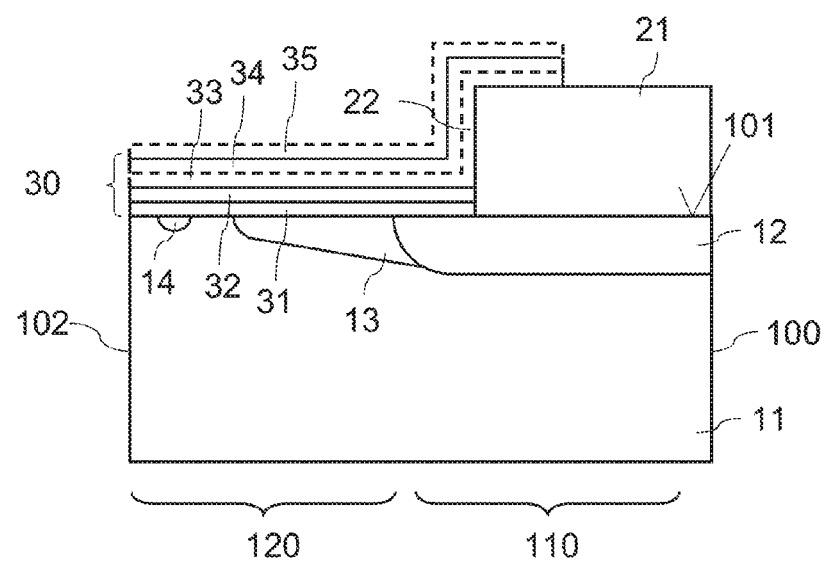
FIG. 2 illustrates a vertical cross sectional view of a semiconductor device including a passivation layer on a first surface and a pn junction in the semiconductor body.

As already mentioned above, the topology of FIG. 1 with the semiconductor body 100, a contact electrode 21 and a passivation layer 30 may be used in a plurality of different semiconductor devices. FIG. 2 illustrates a vertical cross sectional view of a semiconductor device that has the topology of FIG. 1 and that includes a pn junction in the semiconductor body 100. The pn junction is formed between a first doped semiconductor region 11 of a first doping type and a second doped semiconductor region 12 of a second doping type complementary to the first doping type. The second doped semiconductor region 12 is electrically connected to the contact electrode 21. The first doped semiconductor region 11 may extend to the edge region 102 and/or may extend to the first surface 101. The region of the semiconductor body 100 in which the pn junction is formed can be referred to as inner region 110, and the region adjoining the inner region 110 can be referred to as outer region or edge region 120. The edge region 120 may extend from the inner region 110 to the edge surface 102 of the semiconductor body 100. However, this is only an example. According to a further embodiment (not illustrated), further semiconductor regions may adjoin the edge region 120, such as semiconductor regions in which low-voltage semiconductor devices or logic devices are implemented.

Referring to FIG. 2, the pn junction extends to the surface 101 and is covered by the passivation layer 30. That is, the sidewall 22 of the contact electrode 21 is distant to the position where the pn junction extends to the first surface 101.

Optionally, the semiconductor device includes an edge termination structure in the edge region 120 below the passivation layer 30. The edge termination structure may include a VLD (Variation of Lateral Doping) region 13 of the second doping type, and a channel stopper region 14 of the first doping type and more highly doped than the first device region 11. The VLD region 13 and the channel stopper region 14 both adjoin the first surface 101 and are distant in the horizontal (lateral) direction of the semiconductor body 100. It goes without saying that other types of edge termination structures may be used as well in connection with the passivation layer, such as edge termination structures including field rings and/or field plates.

The passivation layer 30 is suitable to be used in high voltage semiconductor devices such as semiconductor devices with a voltage blocking capability of several 100V, or even several kilovolts (kV). The passivation layer is, in particular, suitable to be used in semiconductor devices with a voltage blocking capability of 7 kV and more.

The device topology of FIG. 2 with the semiconductor body 100 including a pn junction, a contact electrode 21 contacting one of the semiconductor regions forming the pn junction, and a passivation layer 30 at least covering those regions of the first surface 101 where the pn junction extends to the surface 101 can be used in a plurality of different semiconductor devices. Two possible embodiments are explained below with reference to FIGS. 3 and 4.

Figure 3:
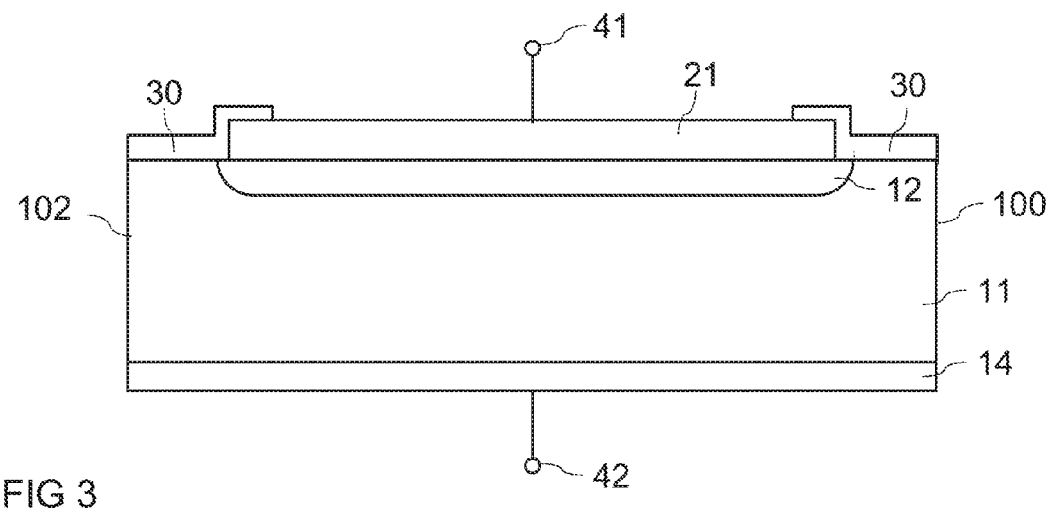
FIG. 3 illustrates a vertical cross sectional view of a semiconductor device implemented as a diode.

Referring to FIG. 3, the semiconductor device may be implemented as a diode, in particular as a power diode. FIG. 3 illustrates a vertical cross sectional view of a power diode having a device topology as explained with reference to FIG. 2. However, the passivation layer 30 is not illustrated in detail in FIG. 3, and the optional edge termination structure is not illustrated. The passivation layer 30 is implemented as explained with reference to FIG. 1 above.

In the diode of FIG. 3, the first device region 11 forms a base region of the diode and the second device region 12 forms one of an n-emitter or a p-emitter of the diode. According to one embodiment, the base region 11 is n-doped, so that the second device region 12 is p-doped and forms a p-emitter (anode) of the diode. The diode further includes a further emitter region 14 of the first doping type, more highly doped than the base region 11, and adjoining the base region 11. The contact electrode 21 is electrically (ohmically) connected to the p-emitter 12 and to a first terminal 41 of the diode. The first terminal 41 forms an anode terminal in the present embodiment. The n-emitter (cathode) of the diode is electrically connected to a second terminal 42 that forms a cathode terminal.

Figure 4:
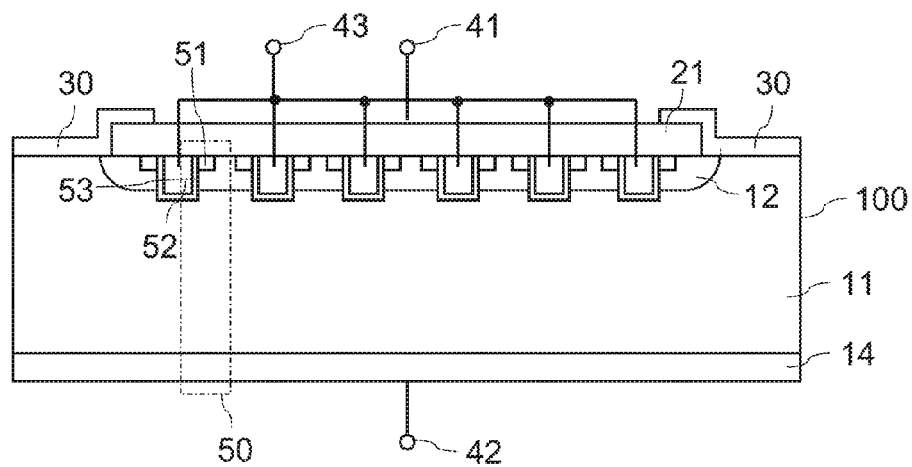
FIG. 4 illustrates a vertical cross sectional view of a semiconductor device implemented as an MOS transistor.

FIG. 4 illustrates a vertical cross sectional view of a further semiconductor device that includes a device topology as explained with reference to FIG. 2. The semiconductor device of FIG. 4 is implemented as an MOS transistor. In this MOS transistor the first device region 11 is a drift region and the second device region 12 is a body region. The MOS transistor includes a plurality of transistor cells 50. Each transistor cell includes a source region 51 separated from the drift region 11 by the body region 12, a gate electrode 52 and a gate dielectric 53 dielectrically insulating the gate electrode 52 from the source region 51, the body region 12 and the drift region 11. The individual transistor cells 50 share the drift region 11 and the drain region 14. The gate electrodes 52 are electrically connected to a gate electrode 43. The contact electrode 21 forms a source electrode that is connected to the first terminal 41 that forms a source terminal. The drain region 14 is connected to a second terminal 52 that forms the drain terminal. The MOS transistor can be implemented as a MOSFET. In this case, the drain region 14 has the same doping type as the drift region 11, but is more highly doped. Alternatively, the MOS transistor is implemented as an IGBT. In this case, the drain region 14 is doped complementarily to the drift region 11. The MOS transistor can be implemented as an n-type or as a p-type transistor. In an n-type transistor the drift region 11 and the source regions 51 are n-doped, while the body region 12 is p-doped. In a p-type transistor, the drift region 11 and the source regions 51 are p-doped, while the body region 12 is n-doped.

Figure 5:
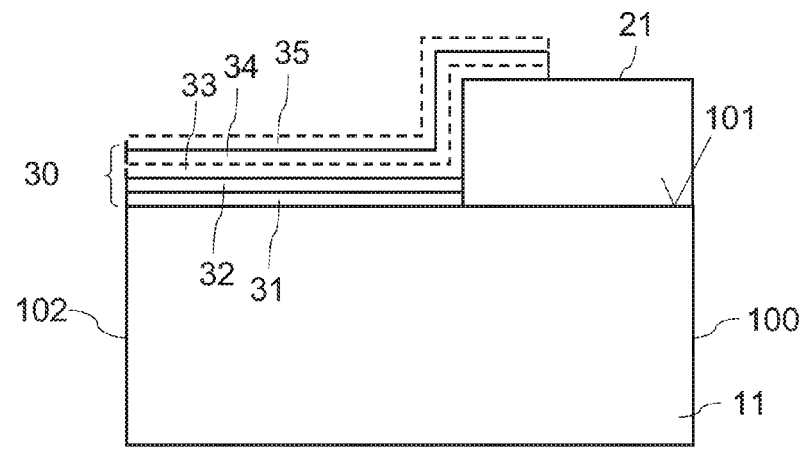
FIG. 5 illustrates a vertical cross sectional view of a semiconductor device implemented as a Schottky diode.

FIG. 5 illustrates a vertical cross sectional view of a section of a further semiconductor device. The semiconductor device of FIG. 5 is implemented as a Schottky diode and includes a Schottky junction between the contact electrode 21 and the semiconductor body 100.

Figure 6:
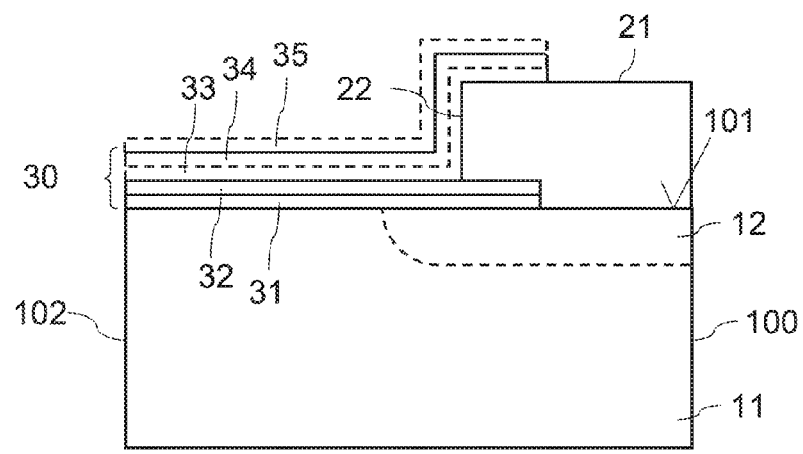
FIG. 6 illustrates a modification of the semiconductor device of FIG. 1.

FIG. 6 illustrates a modification of the device topology of FIG. 1. The device topology of FIG. 6 may be used in each of the semiconductor devices explained before. Referring to FIG. 6, the contact electrode 21 overlaps the amorphous semi-insulating layer 31 and the first nitride layer 32. In case the semiconductor device includes a pn junction (illustrated in dashed lines in FIG. 6), the sidewall 22 of the contact electrode 21 is distant to the position where the pn junction extends to the first surface 101.

FIGS. 7A to 7D illustrate a first embodiment of a method for producing a device topology as illustrated in FIG. 1 or 6.

FIGS. 7A to 7D illustrate vertical cross sectional views of the semiconductor body 100 in different method steps.

Figure 7A:
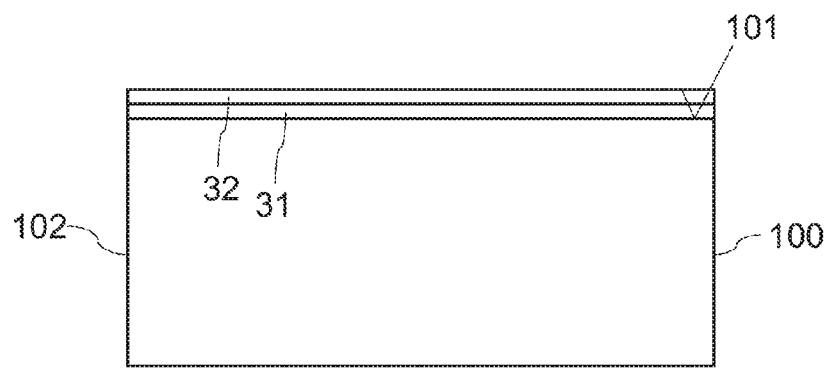
FIG. 7 (that includes FIGS. 7A to 7D) illustrates an embodiment of a method for producing a semiconductor device including a passivation layer on a first surface.
Figure 7B:
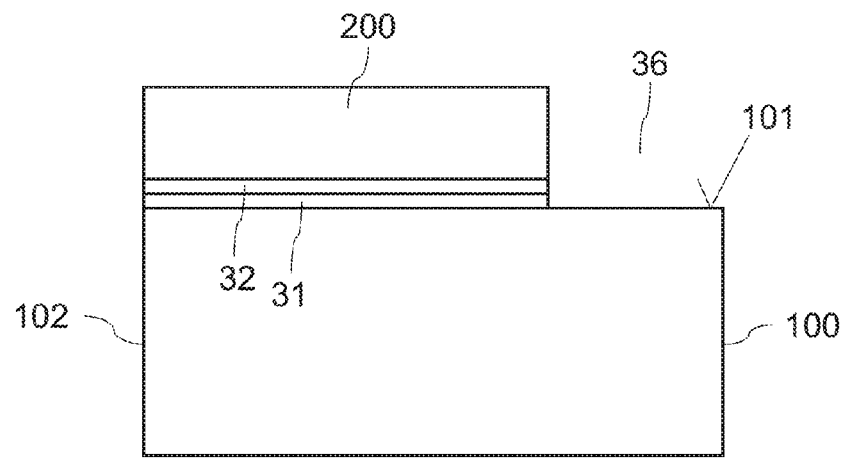

Referring to FIGS. 7A and 7B, the method includes forming the amorphous semi-insulating layer 31 on the first surface 101 and forming the first nitride layer 32 on the amorphous semi-insulating layer 31 such that the layer stack with the amorphous semi-insulating layer 31 and the first nitride layer 32 leaves sections of the first surface 101 uncovered. That is, the layer stack with the two layers 31, 32 has an opening 36. Since FIGS. 7A to 7D only show a section of the semiconductor device, only a section of the opening 36 is shown in FIG. 7B.

Forming the layer stack with the opening 36 may include forming the amorphous semi-insulating layer 31 and the first nitride layer 32 such that these layers completely cover the first surface 101, and then forming the opening 36 in the layer stack. Forming the opening 36 may include an etching process using an etch mask 200. Forming the amorphous semi-insulating layer 31 may include a chemical vapor deposition (CVD) process, such as a PECVD process. The amorphous semi-insulating layer 31 is, for example, one of an aSiC:H layer, an aC:H layer, and an aSi:H layer. Forming the first nitride layer 32 may include a deposition process, such as a CVD process, using a silicon containing precursor, such as $SiH_4$, and a nitrogen containing precursor, such as $NH_3$ or $N_2$. A cleaning process may be performed to clean the amorphous semi-insulating layer 31 before forming the first nitride layer 32. This cleaning process may include a sputter process such as an argon (Ar) sputter process.

Figure 7C:
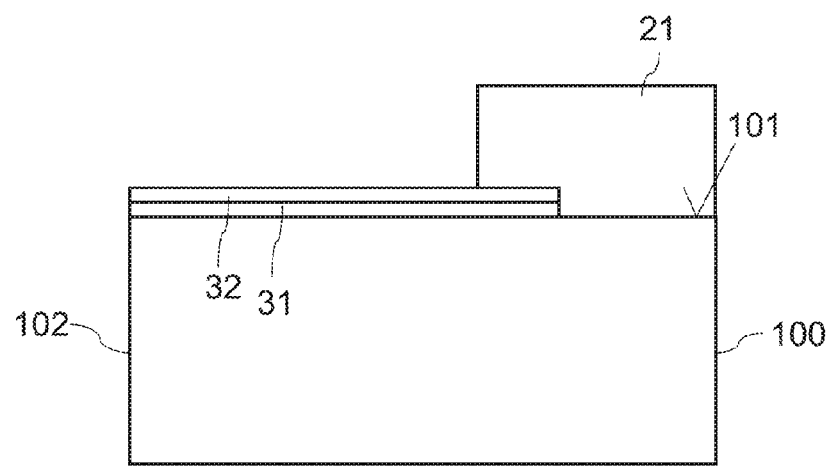

Referring to FIG. 7C, the contact electrode 21 is formed in next process steps. The contact electrode 21 is at least formed in the opening of the first layer stack and at least adjoins the layer stack at a lateral end. Optionally (as illustrated in FIG. 7C), the contact electrode 21 is produced to overlap the layer stack with the amorphous semi-insulating layer 31 and the first nitride layer 32. Forming the contact electrode 21 may include depositing an electrode layer that completely covers the first surface 101 of the semiconductor body 100, and then structuring the electrode layer to form the contact electrode 21 using, e.g., an etching process. According to one embodiment, the contact electrode 21 includes one of aluminum, copper, an aluminum alloy, a copper alloy, and an aluminum-copper alloy.

Figure 7D:
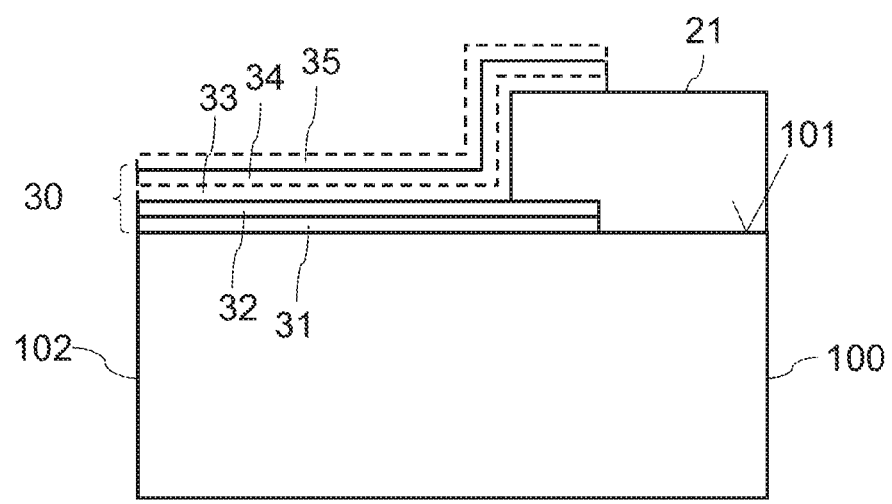

Referring to FIG. 7D, the remaining layers of the layer stack of the passivation layer 30 are produced. That is, the second nitride layer 34 is produced on the first nitride layer 32, the sidewall and sections of the upper surface of the contact electrode 21. Optionally, the intermediate layer 33 is formed on the first nitride layer 32 before forming the second nitride layer 34. Forming the remaining layers of the layer stack may include forming the remaining layers to completely cover the first nitride layer 32 and the contact electrode 21 and then removing the remaining layers from those sections of the upper surface of the contact electrode 21 where the contact electrode 21 is to be uncovered for connection purposes.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting Like terms refer to like elements throughout the description.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a semiconductor device, the method comprising:
   providing a semiconductor body having a first surface;
   forming a first layer stack comprising an amorphous semi-insulating layer and a first nitride layer on the first surface, the first layer stack having an opening, wherein the amorphous semi-insulating layer comprises at least one of aSiC:H, aC:H, and aSi:H;
   forming a contact electrode in the opening;
   forming a second nitride layer on the first layer stack; and
   forming a first doped semiconductor region and a second doped semiconductor region, the first doped semiconductor region and the second doped semiconductor region forming a pn junction, wherein the contact electrode is connected to the second doped semiconductor region.

2. The method of claim 1, wherein the amorphous semi-insulating layer comprises at least one of aSiC:H and aC:H.

3. The method of claim 1, further comprising forming an intermediate layer on the first layer stack before forming the second nitride layer.

4. The method of claim 3, wherein the intermediate layer has a hardness, the hardness of the intermediate layer being lower than a hardness of a material of the contact electrode and being higher than a hardness of one of the first and second nitride layers.

5. The method of claim 3, wherein the intermediate layer comprises silicate glass.

6. The method of claim 3, wherein the contact electrode comprises sidewalls and an upper surface, and wherein the intermediate layer and the second nitride layer are formed so as to cover the sidewalls and a section of the upper surface.

7. The method of claim 1, wherein the contact electrode comprises at least one of aluminum, copper, an aluminum alloy, and a copper alloy.

8. The method of claim 1, wherein the contact electrode is formed so as to overlap the first layer stack.

9. The method of claim 1, wherein the contact electrode comprises sidewalls and an upper surface, and wherein the second nitride layer is formed so as to cover the sidewalls and a section of the upper surface.

10. A method of forming a semiconductor device, the method comprising:
    providing a semiconductor body having a first surface;
    forming a contact electrode arranged over the first surface;
    forming a passivation layer on the first surface adjacent the contact electrode, the passivation layer comprising a layer stack, wherein forming the layer stack comprises forming an amorphous semi-insulating layer on the first surface, a first nitride layer on the amorphous semi-insulating layer, an intermediate layer on the first nitride layer, and a second nitride layer on the intermediate layer, wherein the amorphous semi-insulating layer comprises at least one of aSiC:H, aC:H, and aSi:H; and
    forming a first doped semiconductor region and a second doped semiconductor region, the first doped semiconductor region and the second doped semiconductor region forming a pn junction, wherein the contact electrode is connected to the second doped semiconductor region.

11. The method of claim 10, wherein the intermediate layer comprises one or more of the following:
    wherein the intermediate layer has a hardness that is lower than a hardness of a material of the contact electrode and is higher than a hardness of one of the first and second nitride layers,
    wherein the intermediate layer comprises silicate glass, and
    wherein the intermediate layer has a Young's modulus between 50 GPa and 70 GPa, and wherein a hardness of the intermediate layer is between 7 GPa and 10 GPa.

12. The method of claim 11, wherein the intermediate layer has a hardness that is lower than a hardness of a material of the contact electrode and is higher than a hardness of one of the first and second nitride layers.

13. The method of claim 11, wherein the intermediate layer comprises silicate glass.

14. The method of claim 11, wherein the intermediate layer has a Young's modulus between 50 GPa and 70 GPa, and wherein a hardness of the intermediate layer is between 7 GPa and 10 GPa.

15. The method of claim 10, wherein the amorphous semi-insulating layer comprises at least one of aSiC:H and aC:H.

16. The method of claim 10, wherein the intermediate layer comprises at least one of USG, PSG, BSG, and BPSG.

17. The method of claim 10, wherein the contact electrode has sidewalls and an upper surface, and wherein the intermediate layer and the second nitride layer cover the sidewalls and a section of the upper surface of the contact electrode.

18. The method of claim 10, wherein the contact electrode has sidewalls and an upper surface, and wherein the second nitride layer covers the sidewalls and a section of the upper surface of the contact electrode.

19. The method of claim 10, wherein the contact electrode comprises at least one of aluminum, copper, an aluminum alloy, and a copper alloy.

20. The method of claim 10, wherein the contact electrode overlaps the amorphous semi-insulating layer and the first nitride layer.

21. The method of claim 10, wherein the pn junction extends to the first surface, and wherein the passivation layer covers the pn junction on top of the first surface.

22. The method of claim 10, wherein the contact electrode does not overlap the amorphous semi-insulating layer and the first nitride layer.

23. A method of forming a semiconductor device, the method comprising:
   providing a semiconductor body comprising a first surface;
   forming a contact electrode arranged on the first surface;
   forming a passivation layer on the first surface adjacent the contact electrode by forming a layer stack, wherein forming the layer stack comprises
      forming an amorphous semi-insulating layer on the first surface, wherein the amorphous semi-insulating layer comprises at least one of aSiC:H, aC:H, and aSi:H,
      forming a first nitride layer on the amorphous semi-insulating layer, and
      forming a second nitride layer on the first nitride layer; and
   forming a first doped semiconductor region and a second doped semiconductor region, the first doped semiconductor region and the second doped semiconductor region forming a pn junction, wherein the contact electrode is connected to the second doped semiconductor region.

24. The method of claim 23, further comprising:
   forming a doped semiconductor region contacted by the contact electrode; and
   forming a Schottky junction between the contact electrode and the doped semiconductor region.

25. The method of claim 23, further comprising forming an intermediate layer between the first nitride layer and the second nitride layer.

26. The method of claim 25, wherein the intermediate layer comprises silicate glass.

27. The method of claim 25, wherein the intermediate layer comprises USG, PSG, BSG, or BPSG.

28. The method of claim 25, wherein the contact electrode has sidewalls and an upper surface, and wherein the intermediate layer and the second nitride layer cover the sidewalls and a section of the upper surface of the contact electrode.

29. The method of claim 23, wherein the contact electrode comprises at least one of aluminum, copper, an aluminum alloy, and a copper alloy.

30. The method of claim 23, wherein the contact electrode overlaps the amorphous semi-insulating layer and the first nitride layer.

31. The method of claim 23, wherein the contact electrode has sidewalls and an upper surface, and wherein the second nitride layer covers the sidewalls and a section of the upper surface of the contact electrode.

32. The method of claim 23, wherein the pn junction extends to the first surface, and wherein the passivation layer covers the pn junction on top of the first surface.

33. The method of claim 23, wherein the contact electrode does not overlap the amorphous semi-insulating layer and the first nitride layer.

34. A method of forming a semiconductor device, the method comprising:
   providing a semiconductor body comprising a first surface;
   forming a contact electrode having a first major surface and an opposite second major surface over the semiconductor body, the first major surface contacting the first surface;
   forming an amorphous semi-insulating layer over and contacting the first surface;
   forming a first nitride layer over and contacting the amorphous semi-insulating layer; and
   forming a second nitride layer over and contacting the first nitride layer, wherein the contact electrode overlaps the amorphous semi-insulating layer and the first nitride layer, wherein the second nitride layer is disposed over sidewalls of the contact electrode and contacts the second major surface of the contact electrode.

35. The method of claim 34, further comprising forming an intermediate layer between the first nitride layer and the second nitride layer.

36. The method of claim 35, wherein the intermediate layer comprises silicate glass.

* * * * *